(12) United States Patent
Chung et al.

(10) Patent No.: US 9,437,715 B1
(45) Date of Patent: Sep. 6, 2016

(54) NON-VOLATILE MEMORY AND MANUFACTURING METHOD THEREOF

(71) Applicant: Powerchip Technology Corporation, Hsinchu (TW)

(72) Inventors: Chih-Ping Chung, Hsinchu, TN (US); Ming-Yu Ho, Taichung (TW); Ming-Feng Chang, Taichung (TW); Hung-Kwei Liao, Taoyuan (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/697,635

(22) Filed: Apr. 28, 2015

(30) Foreign Application Priority Data

Feb. 16, 2015 (TW) .................................. 104105298

(51) Int. Cl.
| | |
|---|---|
| *H01L 21/336* | (2006.01) |
| *H01L 29/66* | (2006.01) |
| *H01L 27/115* | (2006.01) |
| *H01L 21/3213* | (2006.01) |
| *H01L 21/3105* | (2006.01) |
| *H01L 21/311* | (2006.01) |

(52) U.S. Cl.
CPC ... *H01L 29/66825* (2013.01); *H01L 21/31051* (2013.01); *H01L 21/31111* (2013.01); *H01L 21/32133* (2013.01); *H01L 27/11521* (2013.01); *H01L 29/66492* (2013.01)

(58) Field of Classification Search
CPC .................. H01L 29/66825; H01L 21/31051; H01L 21/31111; H01L 21/32133; H01L 29/66492; H01L 27/11521; H01L 27/11517; H01L 29/42324; H01L 27/11529; H01L 27/11546; H01L 29/42328
See application file for complete search history.

(56) References Cited

U.S. PATENT DOCUMENTS

| | | | |
|---|---|---|---|
| 5,907,775 A | 5/1999 | Tseng | |
| 2006/0270156 A1* | 11/2006 | Kim | ................... H01L 21/28273 438/257 |
| 2012/0161221 A1* | 6/2012 | Lee | ................... H01L 29/66825 257/316 |

FOREIGN PATENT DOCUMENTS

TW          201205757          2/2012

* cited by examiner

*Primary Examiner* — William F Kraig
*Assistant Examiner* — Stanetta Isaac
(74) *Attorney, Agent, or Firm* — Jianq Chyun IP Office

(57) ABSTRACT

A manufacturing method of a non-volatile memory is provided. A tunneling dielectric layer, a first conductive pattern, and isolation structures are formed on a substrate. Using a first photoresist layer as a mask, the first conductive pattern is partially removed to form a first opening exposing the substrate. An insulating layer is formed to fill the first opening and cover the first conductive pattern and the isolation structures. Using a second photoresist layer shielding a portion of the first conductive pattern as a mask, the insulating layer surrounding the first conductive pattern is removed to form a patterned insulating layer having a second opening exposing a portion of the first conductive pattern. An inter-gate dielectric layer and a second conductive pattern are formed on the first conductive pattern to fill the second opening, the first conductive pattern forms a floating gate, and the second conductive pattern forms a control gate.

11 Claims, 10 Drawing Sheets

NON-VOLATILE MEMORY AND MANUFACTURING METHOD THEREOF

CROSS-REFERENCE TO RELATED APPLICATION

This application claims the priority benefit of Taiwan application serial no. 104105298, filed on Feb. 16, 2015. The entirety of the above-mentioned patent application is hereby incorporated by reference herein and made a part of this specification.

BACKGROUND OF THE INVENTION

1. Field of the Invention

The invention relates to a semiconductor device and a manufacturing method thereof. More particularly, the invention relates to a non-volatile memory and a manufacturing method thereof.

2. Description of Related Art

Due to advantages such as the ability to repeatedly perform operations such as writing (or programming), reading, and erasing of data and retention of stored data even in a power failure, the non-volatile memory device has become a memory device widely adopted in personal computers and electronic equipment.

The traditional non-volatile memory device is generally designed to have a stacked-gate structure including a floating gate and a control gate manufactured through a doped polysilicon process. The floating gate is located between the control gate and the substrate, is in a floating state and not connected to any circuit, and the control gate is connected to a word line. Moreover, a tunneling oxide layer and an inter-gate dielectric layer respectively located between the substrate and the floating gate and between the floating gate and the control gate are further included.

Under the current trend of increased device density, the dimension of the device is reduced according to design specifications. In general, a greater gate coupling ratio between the floating gate and the control gate indicates a smaller working voltage needed for operation. However, as the density of the non-volatile memory is increased, an increase in gate coupling ratio may cause significant mutual interference between floating gates.

It can therefore be known that, in the current trend of miniaturized devices, how to balance device density and device reliability in limited space is a focus of study of various industries.

SUMMARY OF THE INVENTION

The invention provides a non-volatile memory and a manufacturing method thereof capable of increasing gate coupling ratio and reducing mutual interference between floating gates.

A manufacturing method of a non-volatile memory of the invention includes the following steps. A substrate is provided, wherein a tunneling dielectric layer and a first conductive pattern are formed on the substrate in order, and a plurality of isolation structures are formed in the first conductive pattern, the tunneling dielectric layer, and the substrate. A first photoresist layer is formed on the substrate, and the first photoresist layer exposes a portion of the first conductive pattern and a portion of the isolation structures. A portion of the first conductive pattern is removed by using the first photoresist layer as a mask to form a first opening between the isolation structures and the first conductive pattern, and the first opening exposes the substrate. The first photoresist layer is removed. An insulating layer is formed on the substrate, and the insulating layer completely fills the first opening and covers the first conductive pattern and the isolation structures. A second photoresist layer is formed on a portion of the insulating layer, and the second photoresist layer shields a portion of the first conductive pattern. A portion of the insulating layer and a portion of the isolation structures located in the periphery of the first conductive pattern are removed by using the second photoresist layer as a mask, wherein the insulating layer and the isolation structures remaining on the substrate form a patterned insulating layer, the patterned insulating layer has a second opening, and the second opening exposes the top portion and the sidewall of the first conductive pattern. The second photoresist layer is removed. An inter-gate dielectric layer is formed on the first conductive pattern. A second conductive pattern is formed on the inter-gate dielectric layer, and the second conductive pattern completely fills the second opening, wherein the second conductive pattern forms a control gate, the first conductive pattern forms a floating gate, and the control gate covers and surrounds the floating gate.

In an embodiment of the invention, before the insulating layer is formed, a doping process is further performed to form a source/drain lightly doped region in the substrate through the first opening.

In an embodiment of the invention, a portion of the first conductive pattern is removed through an etching process, and an etch selectivity is present between the material of the first conductive pattern and the material of the isolation structures.

In an embodiment of the invention, after the insulating layer is formed, a planarization process is further performed on the insulating layer.

In an embodiment of the invention, a portion of the insulating layer and a portion of the isolation structures are removed through an etching process, and an etch selectivity is present between the material of the first conductive pattern and the material of the insulating layer and the isolation structures.

In an embodiment of the invention, the patterned insulating layer surrounds the first conductive pattern, and the top portion of the patterned insulating layer is higher than the top portion of the first conductive pattern.

In an embodiment of the invention, the bottom portion of the second opening is higher than the bottom portion of the first conductive pattern.

In an embodiment of the invention, the method of forming the inter-gate dielectric layer and the second conductive pattern includes: forming a dielectric material layer on the patterned insulating layer; forming a conductive material layer on the dielectric material layer, wherein the conductive material layer completely fills the second opening and covers the first conductive pattern and the dielectric material layer; and performing a planarization process on the dielectric material layer and the conductive material layer by using the top portion of the patterned insulating layer as a stop layer.

In an embodiment of the invention, after the second conductive pattern is formed, the patterned insulating layer remaining on the sidewall of the second conductive pattern is further removed; and a spacer is formed on the sidewall of the second conductive pattern.

In an embodiment of the invention, a source and drain region is further formed in the substrate at two sides of the floating gate.

In an embodiment of the invention, the thickness of the patterned insulating layer located in the periphery of the bottom portion of the floating gate is greater than the thickness of the tunneling dielectric layer.

Based on the above, in the invention, a control gate having a specific configuration is formed through a process to increase gate coupling ratio and reduce mutual interference between floating gates. Moreover, the issue of reliability caused by damage to the edge of the tunneling dielectric layer below the gate can be further prevented, and the occurrence of the phenomenon in which external ions are diffused to the tunneling dielectric layer can be prevented.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
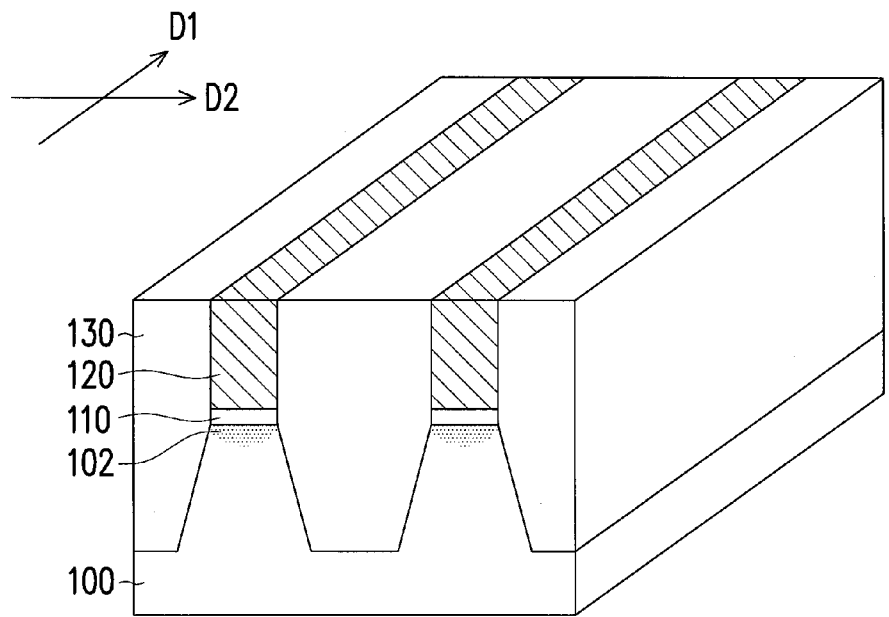
FIG. 1A to FIG. 1I are stereoscopic schematics of the manufacturing process of a non-volatile memory illustrated according to an embodiment of the invention.
Figure 1B:
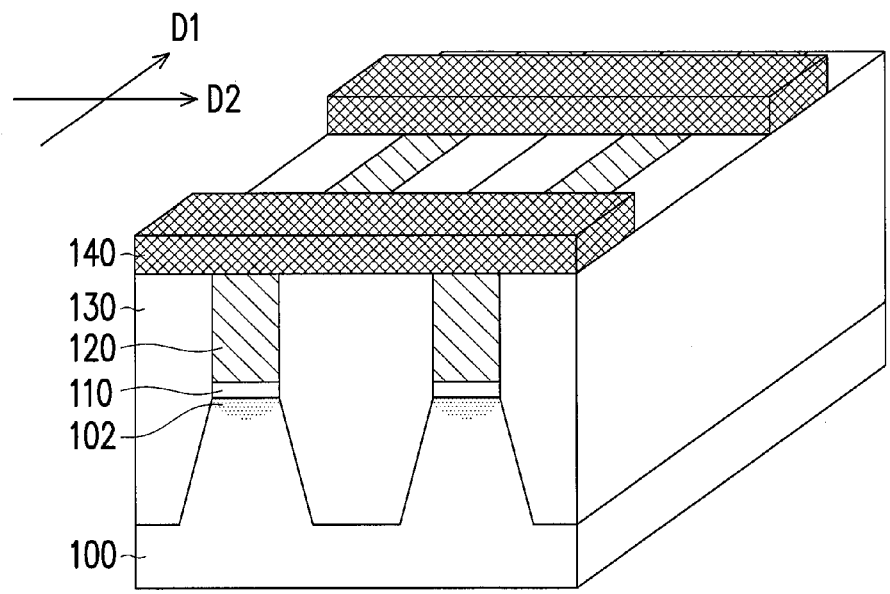
Figure 1C:
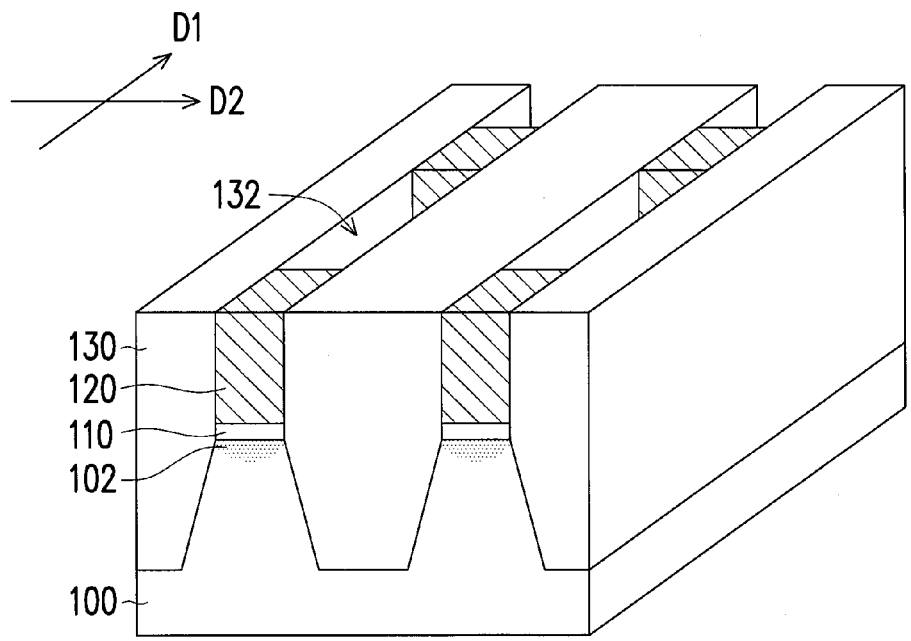
Figure 1D:
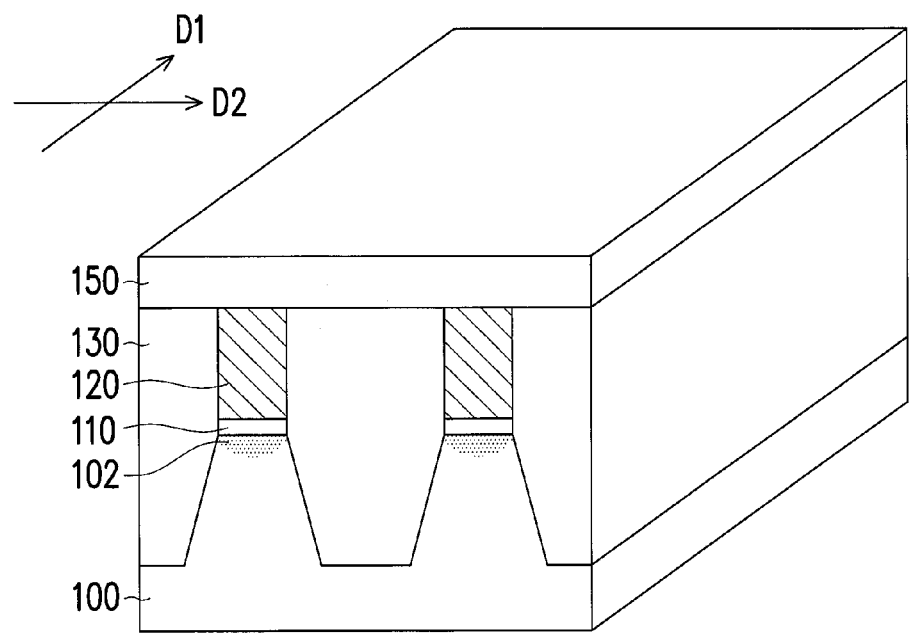
Figure 1E:
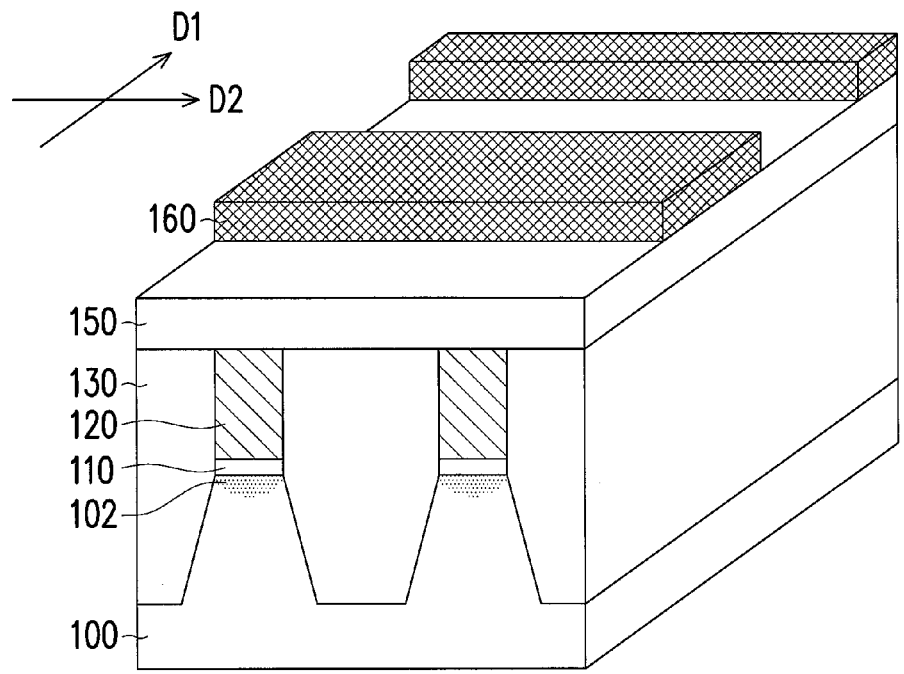
Figure 1F:
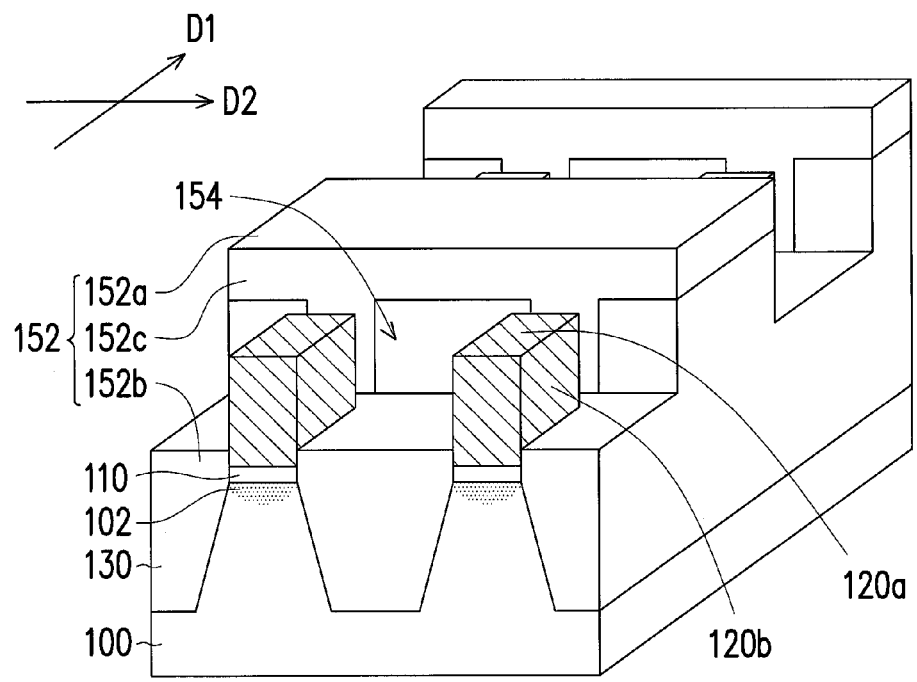
Figure 1G:
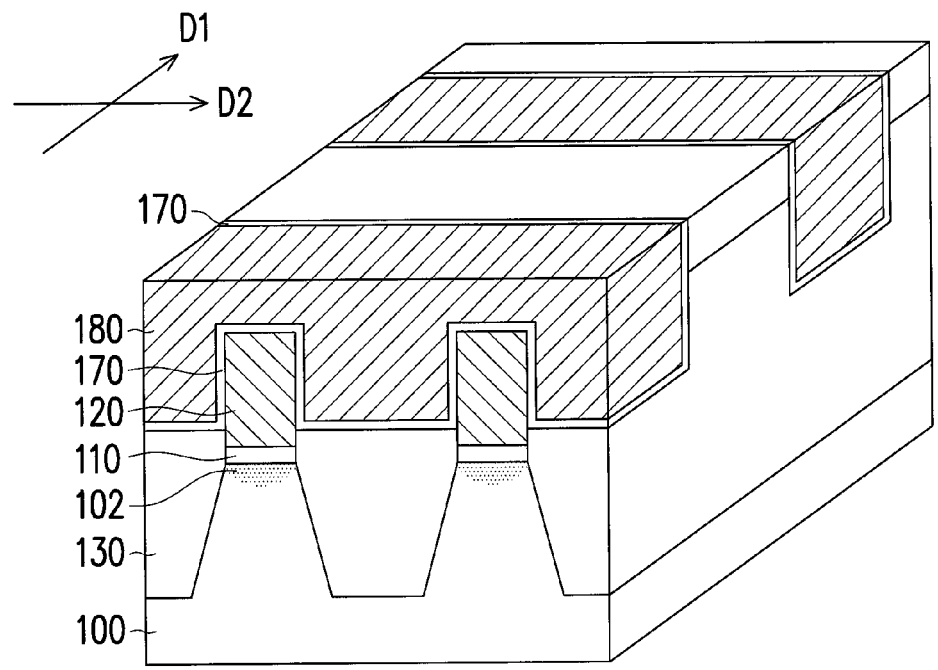
Figure 1H:
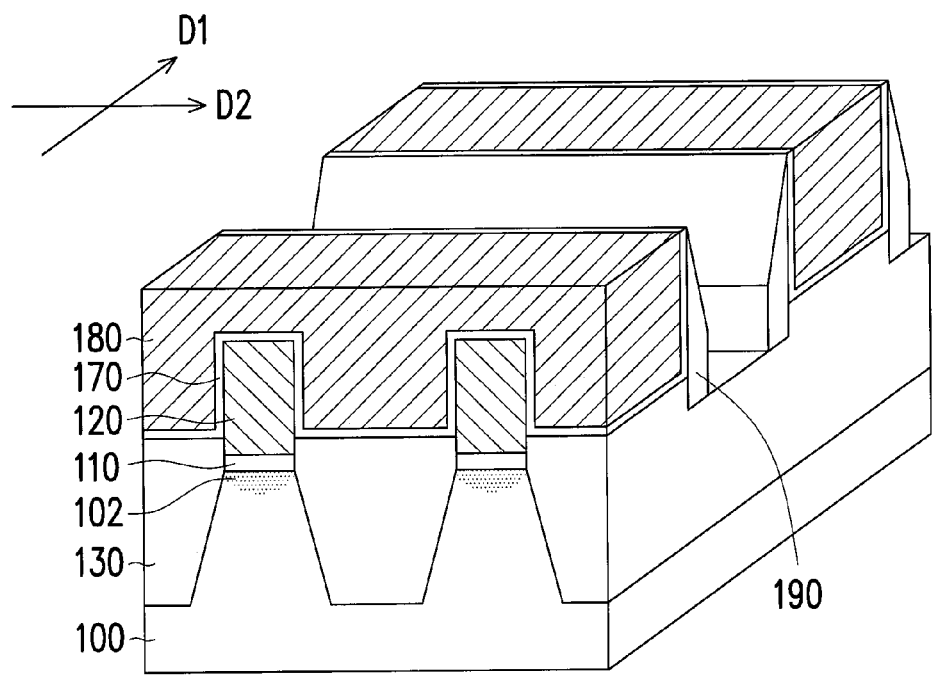
Figure 1I:
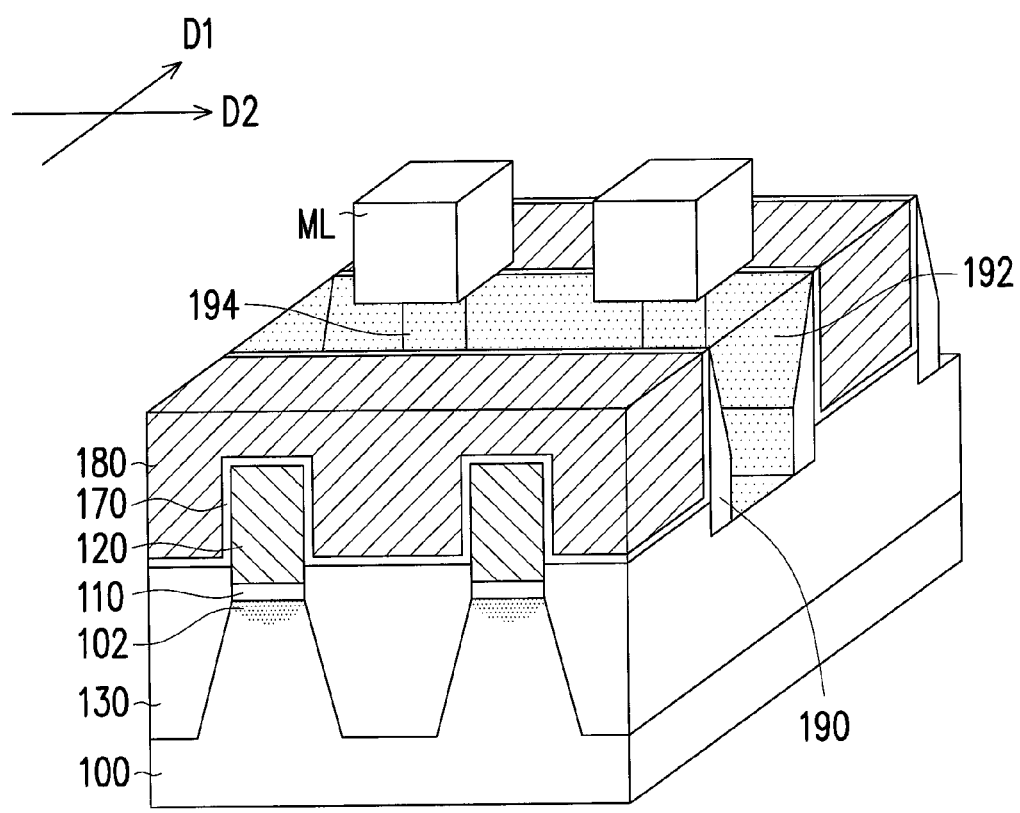
Figure 2A:
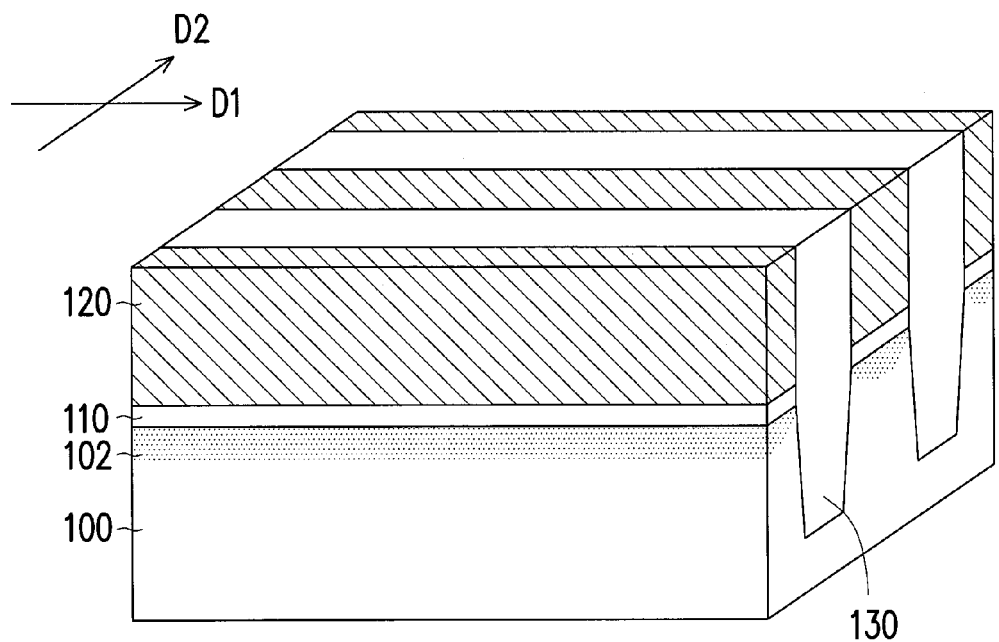
FIG. 2A to FIG. 2I are stereoscopic schematics of the manufacturing process of a non-volatile memory illustrated according to an embodiment of the invention.

FIG. 1A to FIG. 1I are stereoscopic schematics of the manufacturing process of a non-volatile memory illustrated according to an embodiment of the invention, and FIG. 2A to FIG. 2I are stereoscopic schematics of the manufacturing process of a non-volatile memory illustrated according to an embodiment of the invention, wherein FIG. 1A to FIG. 1I are stereoscopic cross-sectional schematics along a word line, and FIG. 2A to FIG. 2I are stereoscopic cross-sectional schematics along a bit line. Referring to FIG. 1A and FIG. 2A, first, a substrate 100 is provided, wherein a tunneling dielectric layer 110 and a first conductive pattern 120 are formed on the substrate 100 in order, and a plurality of isolation structures 130 are formed in the first conductive pattern 120, the tunneling dielectric layer 110, and the substrate 100. The substrate 100 is, for instance, a silicon substrate. The material of the tunneling dielectric layer 110 is, for instance, silicon oxide, and the forming method thereof is, for instance, a thermal oxidation method. The first conductive pattern 120 is, for instance, a strip, and is extended along a first direction D1. In the present embodiment, the first direction D1 is, for instance, the extending direction of a bit line. The material of the first conductive pattern 120 is, for instance, polysilicon, and the forming method thereof is, for instance, a chemical vapor deposition process. The isolation structures 130 are, for instance, self-aligned shallow-trench isolation structures, and are, for instance, located in the substrate 100 at two sides of the first conductive pattern 120. The material of the isolation structures 130 is, for instance, silicon nitride, silicon oxide, or other insulating materials. In the present embodiment, a channel doped region 102 is further included, wherein the channel doped region 102 is formed in the substrate 100 below the first conductive pattern 120. The forming method of the channel doped region 102 is, for instance, an ion implantation process for adjusting the gate threshold voltage.

Figure 2B:
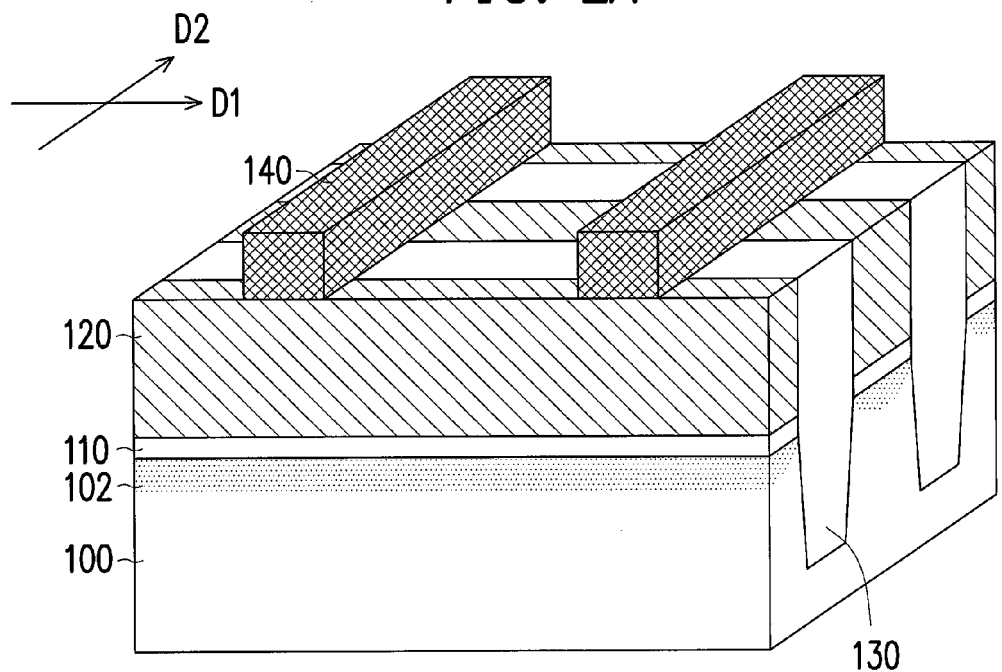

Referring to FIG. 1B and FIG. 2B, then, a first photoresist layer 140 is formed on the substrate 100, and the first photoresist layer 140 exposes a portion of the first conductive pattern 120 and a portion of the isolation structures 130. The first photoresist layer 140 is, for instance, a strip, and is extended along a second direction D2. The second direction D2 and the first direction D1 are not parallel, and the second direction D2 is, for instance, perpendicular to the first direction D1. In the present embodiment, the second direction D2 is, for instance, the extending direction of a word line.

Figure 2C:
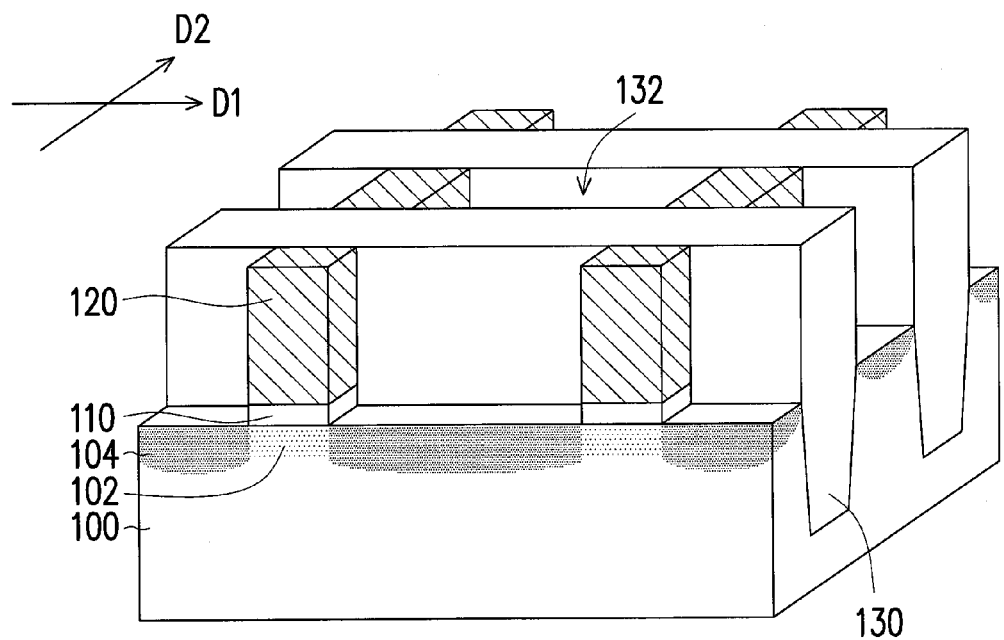

Then, referring to FIG. 1C and FIG. 2C, using the first photomask layer 140 as a mask, a portion of the first conductive pattern 120 is removed to form a first opening 132 between the isolation structures 130 and the first conductive pattern 120, and the first opening 132 exposes the substrate 100. In particular, the patterned first conductive pattern 120 forms a plurality of floating gates separated from one another. In the present embodiment, the method of removing a portion of the first conductive pattern 120 is, for instance, an etching process, wherein a high etch selectivity is present between the material of the first conductive pattern 120 and the material of the isolation structures 130. It should be mentioned that, in an embodiment, the etching process may remove a portion of the isolation structures 130 not shielded by the first photoresist layer 140 at the same time.

Then, the first photoresist layer 140 is removed. Then, a doping process is performed on the substrate 100 to form a source/drain lightly doped region 104 in the substrate 100 at two sides of the first conductive pattern 120. The source/drain lightly doped region 104 is, for instance, located in the substrate 100 below two sides of the first conductive pattern 120. It should be mentioned that, in another embodiment, the first photoresist layer 140 can also be used as a mask, and doping can be performed on the substrate 100 through the first opening 132 to form the source/drain lightly doped region 104 in the substrate 100.

Figure 2D:
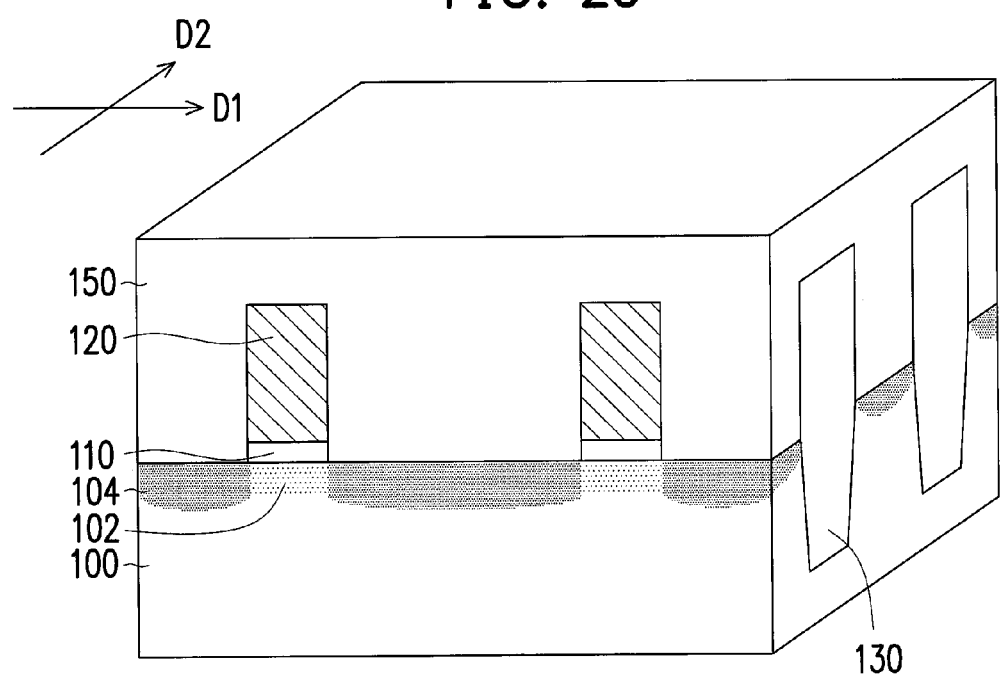

Referring to FIG. 1D and FIG. 2D, then, an insulating layer 150 is formed on the substrate 100, and the insulating layer 150 completely fills the first opening 132 and covers the first conductive pattern 120 and the isolation structures 130. The material of the insulating layer 150 is, for instance, silicon nitride, silicon oxide, or other insulating materials. In the present embodiment, the insulating layer 150 and the isolation structures 130 can have the same or similar materials. The forming method of the insulating layer 150 includes, for instance, forming an insulating material layer on the substrate 100 to completely fill the first opening 132 and cover the first conductive pattern 120 and the isolation structures 130, and then performing, for instance, a planarization process such as a mechanical polishing process on the insulating material layer to form an insulating layer 150 having a planar top surface.

Figure 2E:
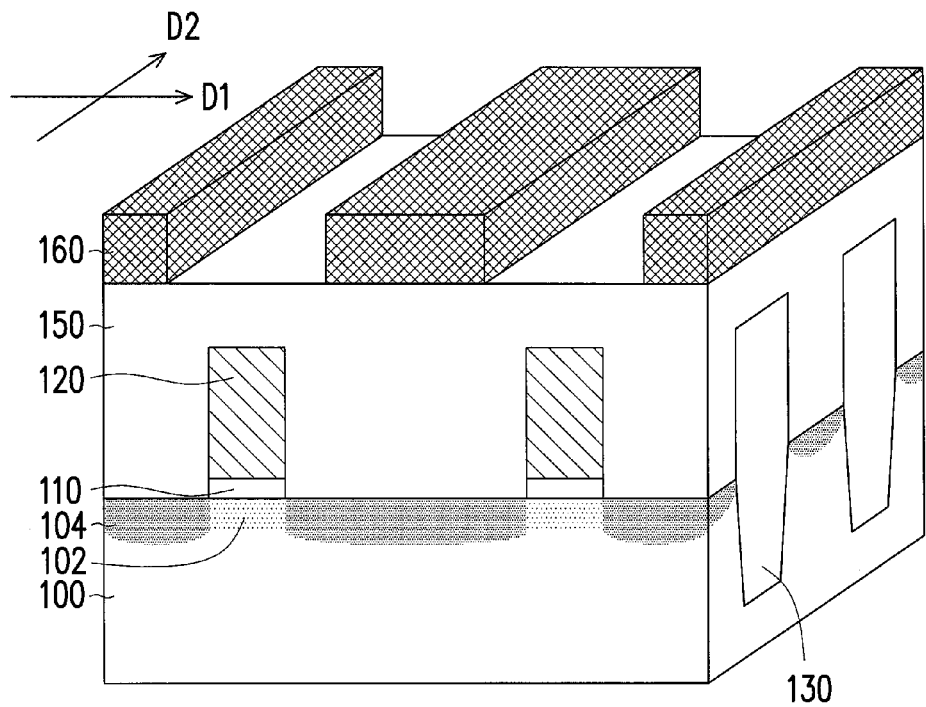

Referring to FIG. 1E and FIG. 2E, next, a second photoresist layer 160 is formed on a portion of the insulating layer 150, and the second photoresist layer 160 shields a portion of the first conductive pattern 120. The second photoresist layer 160 is, for instance, a strip, and is extended along the second direction D2. In particular, the locations of the first photoresist layer 140 and the second photoresist layer 160 are, for instance, partially overlapped, but are not limited thereto.

Figure 2F:
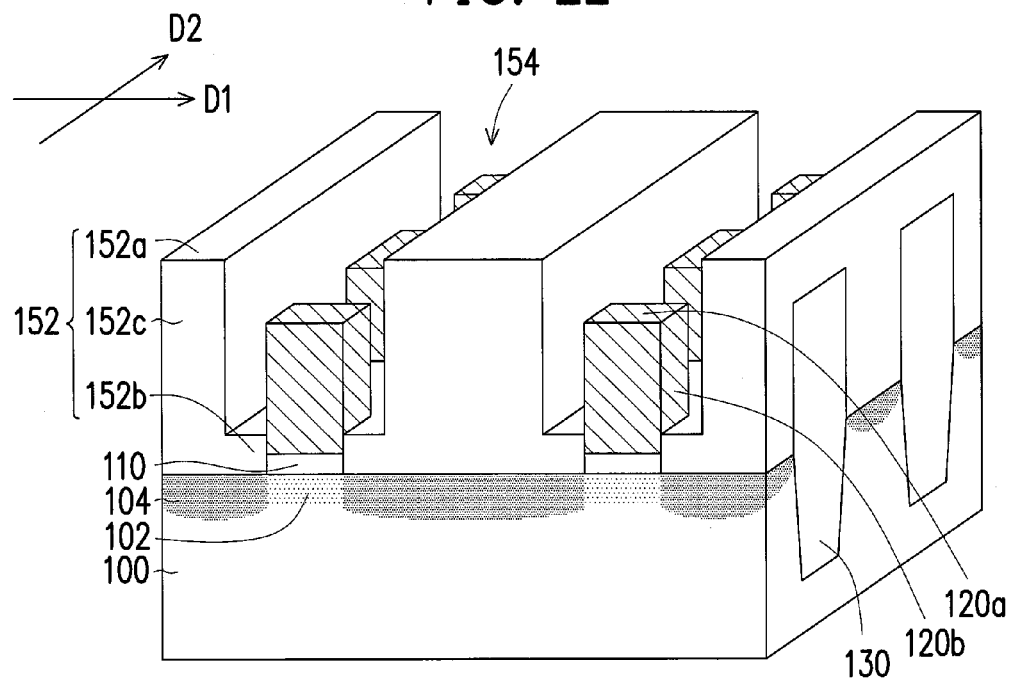

Then, referring to FIG. 1F and FIG. 2F, using the second photoresist layer 160 as a mask, a portion of the insulating layer 150 and a portion of the isolation structures 130 located in the periphery of the first conductive pattern 120 are removed to form a second opening 154, and the second opening 154 exposes a top portion 120a and a portion of a sidewall 120b of the first conductive pattern 120. In the present embodiment, the insulating layer 150 and the isolation structures 130 not removed and remaining on the substrate 100 are collectively referred to as a patterned insulating layer 152, the patterned insulating layer 152 has a second opening 154, and the first conductive pattern 120 is located in the second opening 154. The patterned insulating layer 152 surrounds the first conductive pattern 120, and a top portion 152a of the patterned insulating layer 152 is higher than the top portion 120a of the first conductive pattern 120. The patterned insulating layer 152 includes a bottom portion 152b and a sidewall 152c, the bottom portion 152b is located on the substrate 100 in the periphery of the first conductive pattern 120, the top surface of the bottom portion 152b is higher than the bottom portion of the first conductive pattern 120, and the sidewall 152c surrounds the bottom portion 152b and the first conductive pattern 120. Then, the second photoresist layer 160 is removed. In the present embodiment, the method of removing a portion of the insulating layer 150 and a portion of the isolation structures 130 is, for instance, an etching process, wherein a high etch selectivity is present between the material of the first conductive pattern 120 and the material of the insulating layer 150 and the isolation structures 130.

Figure 2G:
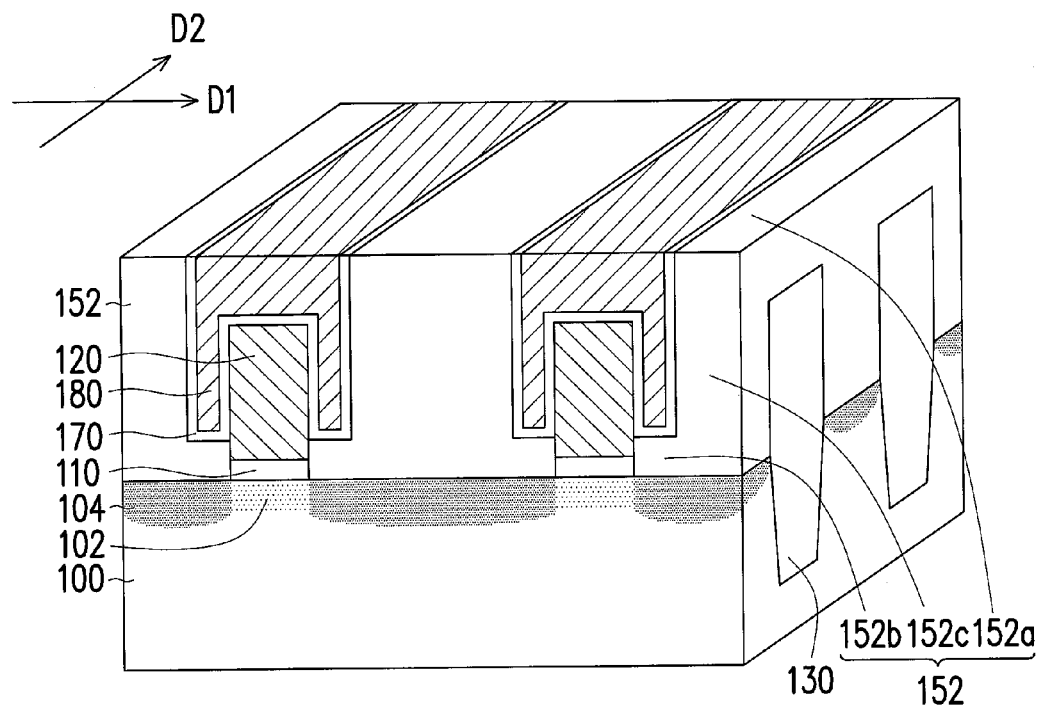

Referring to FIG. 1G and FIG. 2G, then, an inter-gate dielectric layer 170 is formed on the first conductive pattern 120. The inter-gate dielectric layer 170 includes, for instance, three layers such as oxide layer/nitride layer/oxide layer. The inter-gate dielectric layer 170 is, for instance, conformally formed on the surfaces of the patterned insulating layer 152 and the first conductive pattern 120. Then, a second conductive pattern 180 is formed on the inter-gate dielectric layer 170, and the second conductive pattern 180 completely fills the second opening 154. The second conductive pattern 180 is, for instance, a strip, and is extended along the second direction D2 to cover the first conductive pattern 120 arranged in the same row. The forming method of the inter-gate dielectric layer 170 and the second conductive pattern 180 includes, for instance, forming a dielectric material layer and a conductive material layer on the patterned insulating layer 152 in order, wherein the conductive material layer completely fills the second opening 154 and covers the first conductive pattern 120 and the dielectric material layer, and then a planarization process such as chemical mechanical polishing is performed on the conductive material layer and the dielectric material layer by using the top surface of the patterned insulating layer 152 as a stop layer. As a result, the second conductive pattern 180, the inter-gate dielectric layer 170, and the patterned insulating layer 152 have, for instance, substantially level top surfaces, wherein the second conductive pattern 180 forms a control gate, the first conductive pattern 120 forms a floating gate, and the control gate covers and surrounds the floating gate.

Figure 2H:
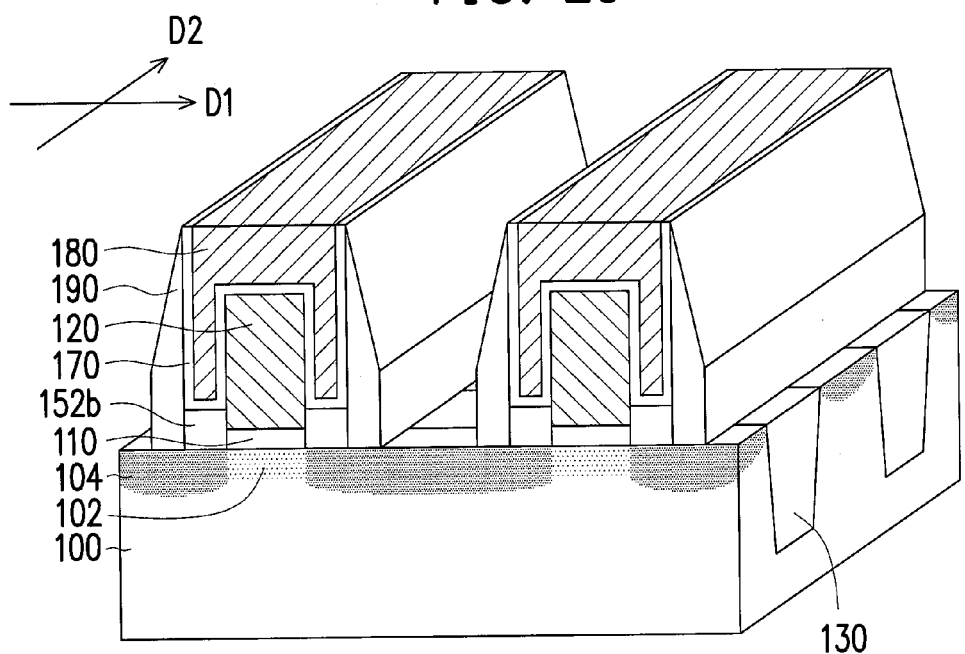

Referring to FIG. 1H and FIG. 2H, in the present embodiment, a spacer 190 is further formed on the sidewall of the second conductive pattern 180. The forming method of the spacer 190 can include first removing the patterned insulating layer 152 (i.e., sidewall 152c) remaining on the sidewall of the second conductive pattern 180, and then forming a spacer on the sidewall of the second conductive pattern 180. Alternatively, in an embodiment, a portion of the sidewall 152c of the patterned insulating layer 152 can also be removed, and the insulating layer remaining on the sidewall of the second conductive pattern 180 is used as the spacer 190. Moreover, the spacer 190 can be a single layer structure or a multilayer structure, wherein any layer thereof can be a portion of the sidewall 152c remaining on the second conductive pattern 180 or an insulating material formed in addition. It should be mentioned that, the bottom portion 152b of the patterned insulating layer 152 remains below the stacked gate structure, and therefore the thickness of the patterned insulating layer 152 located in the periphery of the bottom portion of the first conductive pattern 120 (i.e., floating gate) is greater than the thickness of the tunneling dielectric layer 110.

Figure 2I:
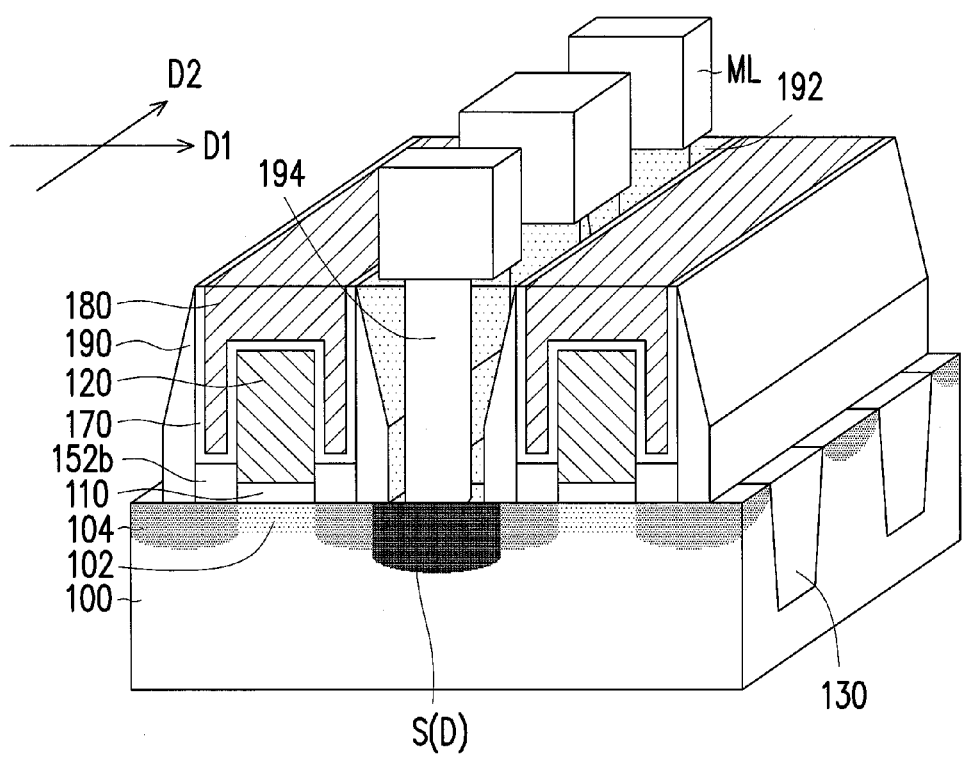

Referring to FIG. 1I and FIG. 2I, then, a source S and a drain D are formed in the substrate 100 at two sides of the stacked gate structure of the first conductive pattern 120 and the second conductive pattern 180. Then, an interlayer dielectric layer 192 having a contact 194 is formed on the substrate 100, wherein the contact 194 exposes the second conductive pattern 180, the source S, or the drain D. Then, a wire ML electrically connected to the second conductive pattern 180, the source S, or the drain D respectively through the contact 194 is formed on the interlayer dielectric layer 192.

In the present embodiment, the inter-gate dielectric layer formed between the control gate and the floating gate has a reverse U shape, and therefore the gate coupling ratio between the control gate and the floating gate is significantly increased. Moreover, the control gate covers the sidewall of the floating gate, and therefore has shielding effect that can prevent mutual interference between adjacent floating gates. Moreover, the patterned insulating layer remains at two sides of the bottom portion of the stacked gate structure. That is, the edge of the bottom portion of the floating gate is surrounded by the insulating layer having a greater thickness, and therefore damage to the edge of the tunneling dielectric layer below the floating gate can be prevented, and device reliability is increased as a result.

Based on the above, in the invention, a control gate having a specific configuration is formed through a process to increase gate coupling ratio and reduce mutual interference between floating gates. Moreover, the issue of reliability caused by damage to the edge of the tunneling dielectric layer of the gate can be further prevented, and the occurrence of the phenomenon in which external ions are diffused to the tunneling dielectric layer can be prevented. As a result, the non-volatile memory has better device characteristics and reliability.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a non-volatile memory, comprising:
   providing a substrate, wherein a tunneling dielectric layer and a first conductive pattern are formed on the substrate in order, and a plurality of isolation structures are formed in the first conductive pattern, the tunneling dielectric layer, and the substrate;
   forming a first photoresist layer on the substrate, wherein the first photoresist layer exposes a portion of the first conductive pattern and a portion of the isolation structures;

removing a portion of the first conductive pattern by using the first photoresist layer as a mask to form a first opening between the isolation structures and the first conductive pattern, wherein the first opening exposes the substrate;

removing the first photoresist layer;

forming an insulating layer on the substrate, wherein the insulating layer completely fills the first opening and covers the first conductive pattern and the isolation structures;

forming a second photoresist layer on a portion of the insulating layer, wherein the second photoresist layer shields a portion of the first conductive pattern;

by using the first photoresist layer as a mask, removing a portion of the insulating layer and a portion of the isolation structures located in a periphery of the first conductive pattern, wherein the insulating layer and the isolation structures remaining on the substrate form a patterned insulating layer, the patterned insulating layer has a second opening, and the second opening exposes a top portion and a sidewall of the first conductive pattern;

removing the second photoresist layer;

forming an inter-gate dielectric layer on the first conductive pattern, wherein the insulating layer remaining on the substrate is disposed between the inter-gate dielectric layer and the substrate;

forming a second conductive pattern on the inter-gate dielectric layer, wherein the second conductive pattern completely fills the second opening and thus the insulating layer remaining on the substrate is disposed on a sidewall of the second conductive pattern, the second conductive pattern forms a control gate, the first conductive pattern forms a floating gate, and the control gate covers and surrounds the floating gate; and removing a portion of the insulating layer remaining on the substrate to form an insulator pattern at two sides of a bottom portion of the floating gate and under a portion of the control gate on two sides of the floating gate.

2. The method of claim 1, further comprising, before forming the insulating layer, performing a doping process to form a source/drain lightly doped region in the substrate through the first opening.

3. The method of claim 1, wherein a portion of the first conductive pattern is removed through an etching process, and an etch selectivity is present between the material of the first conductive pattern and the material of the isolation structures.

4. The method of claim 1, further comprising, after forming the insulating layer, performing a planarization process on the insulating layer.

5. The method of claim 1, wherein a portion of the insulating layer and a portion of the isolation structures are removed through an etching process, and an etch selectivity is present between the material of the first conductive pattern and the material of the insulating layer and the isolation structures.

6. The method of claim 1, wherein the patterned insulating layer surrounds the first conductive pattern, and a top portion of the patterned insulating layer is higher than a top portion of the first conductive pattern.

7. The method of claim 1, wherein a bottom portion of the second opening is higher than a bottom portion of the first conductive pattern.

8. The method of claim 1, wherein a method of forming the inter-gate dielectric layer and the second conductive pattern comprises:

forming a dielectric material layer on the patterned insulating layer;

forming a conductive material layer on the dielectric material layer, wherein the conductive material layer completely fills the second opening and covers the first conductive pattern and the dielectric material layer; and performing a planarization process on the dielectric material layer and the conductive material layer by using a top portion of the patterned insulating layer as a stop layer.

9. The method of claim 1, further comprising, after forming the insulator pattern, forming a spacer on the sidewall of the second conductive pattern.

10. The method of claim 1, further comprising forming a source and drain region in the substrate at two sides of the floating gate.

11. The method of claim 1, wherein a thickness of the patterned insulating layer located in a periphery of a bottom portion of the floating gate is greater than a thickness of the tunneling dielectric layer.

* * * * *